United States Patent [19]

Jinbo

[11] Patent Number: 5,295,106

[45] Date of Patent: Mar. 15, 1994

[54] ROW DECODING CIRCUIT

[75] Inventor: Toshikatsu Jinbo, Tokyo, Japan

[73] Assignee: NEC Corporation, Tokyo, Japan

[21] Appl. No.: 979,796

[22] Filed: Nov. 20, 1992

[30] Foreign Application Priority Data

Nov. 20, 1991 [JP] Japan .................. 3-303695

[51] Int. Cl.[5] .............................................. G11C 7/00
[52] U.S. Cl. ............................ 365/218; 365/230.06
[58] Field of Search ............. 365/218, 230.06, 189.11, 365/189.04; 307/449

[56] References Cited

U.S. PATENT DOCUMENTS

| | | | |
|---|---|---|---|
| 4,247,918 | 1/1981 | Iwahashi | 365/218 |
| 4,737,936 | 4/1988 | Takeuchi | 307/449 |
| 5,039,882 | 8/1991 | Arakawa | 307/449 |

OTHER PUBLICATIONS

"An 80-ns 1-Mb Flash-Memory with On-Chip Erase/Erase-Verify Controller", IEEE Journal of Solid-State Circuits, vol. 25, No. 5, pp. 1147-1151, 1990.

"A New Erasing and Row Decoding Scheme for Low Supply Voltage Operation 16 Mb/64 Mb Flash EE-PROMs", Digest of Technical Papers, the 1991 Symposium on VLSI Circuits (IEEE Cat. No. 91, CH 3018.9).

"256K CMOS EPROM", Digest of Technical Papers, The 1984 IEEE International Solid-State Circuit Conference, pp. 183 and 139.

Primary Examiner—Eugene R. LaRoche
Assistant Examiner—A. Zarahian
Attorney, Agent, or Firm—Sughrue, Mion, Zinn, Macpeak & Seas

[57] ABSTRACT

A row decoding circuit for an EEPROM is described. The row decoding circuit includes a first circuit and a second circuit. The first circuit delivers to a word line a predetermined dc voltage in response to a decode signal during both read operation and write operation and stops delivering the predetermined dc voltage when the word line is selected during erase operation. The predetermined dc voltage is the read voltage when the word line is selected during read operation, is the write voltage when the word line is selected during write operation and is a prescribed voltage level when the word line is not selected during either read operation or write operation. The second circuit delivers to the word line a negative erasure voltage in response to the decode signal when the word line is selected during erase operation and stops delivering any voltage to the word line when the word line is not selected during erase operation. The second circuit stops delivering any voltage to the word line when the word line is selected during both read operation and write operation.

11 Claims, 6 Drawing Sheets

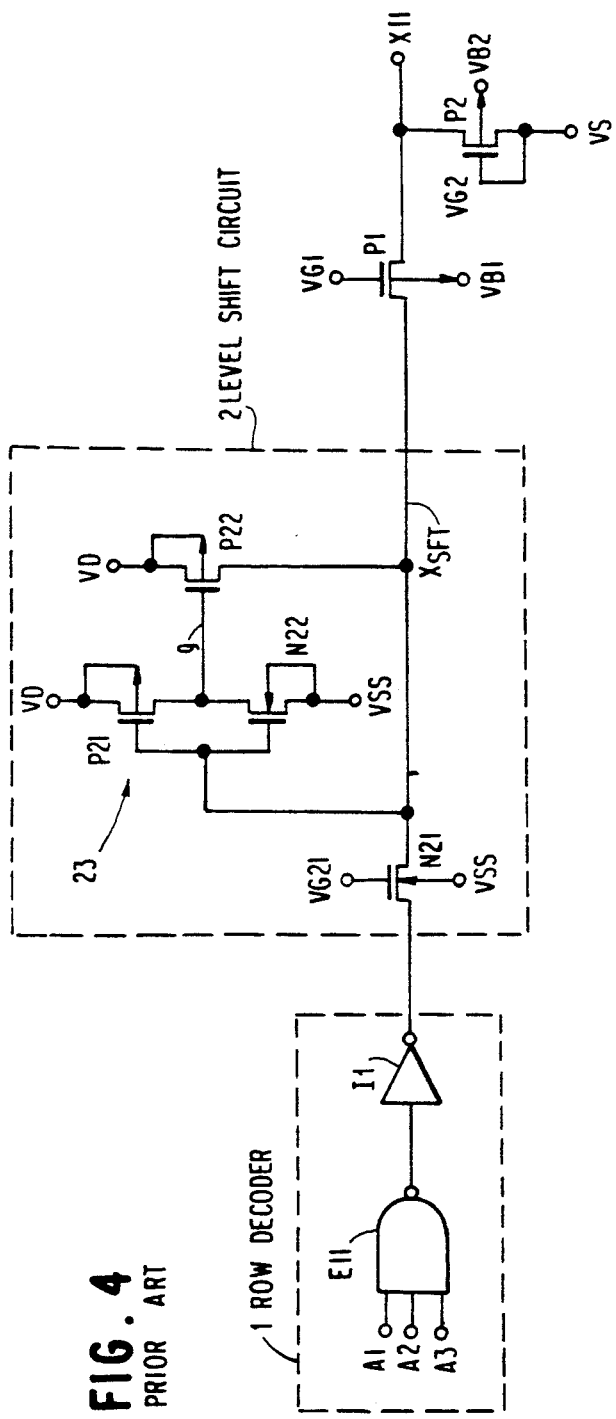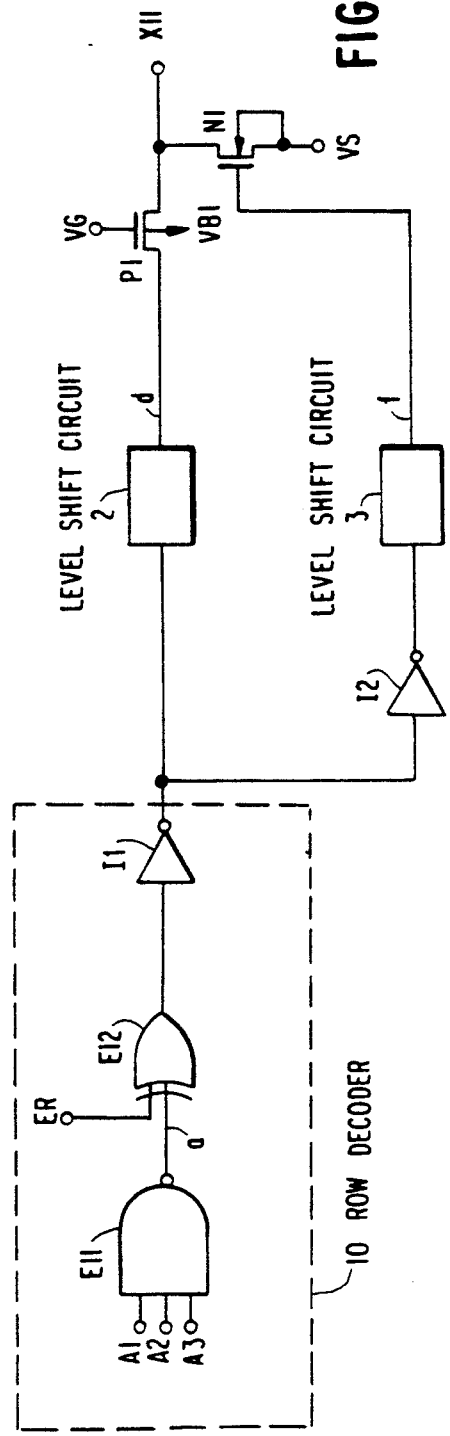
FIG. 4
PRIOR ART
FIG. 5

ROW DECODING CIRCUIT

BACKGROUND OF THE INVENTION

1. Field of the Invention

The present invention relates to a row decoder and in particular to a row decoder for a flash EEPROM.

2. Description of the Related Art

Flash EEPROMs are characterized by electrical erasability and reprogrammability. Since flash EEPROMs (hereafter referred to as flash memories) fit any application that requires high density arrangement and reprogrammability, many investigations have been undertaken recently. Seki et al. presented a paper on an internal erase and erase-verify control system for a flash memory in the IEEE Journal of Solid-State Circuits, Vol. 25, No. 5, pp. 1147–1151, 1990. The flash memory used by the authors is of the one-transistor type with a stacked gate structure. FIG. 1 is a schematic cross-sectional view of the memory cell. N-type drain 202 and source 203 are formed in P-type substrate 201, and control gate 205 and floating gate 204 insulated by insulating layer 206 are provided above the channel region of substrate 201. An oxide layer approximately 10 nm thick, commonly called a tunnel oxide layer, is formed between floating gate 204 and the channel region.

Writing to the memory cell is effected both by applying a high potential (typically 12 V) to control gate 205 and drain 202, and by applying the ground potential to source 203, whereby an avalanche breakdown is caused, allowing hot electrons created by the breakdown to inject into floating gate 204. Erasure of written data is effected by applying the ground potential to control gate 205 and the high potential to source 203 with drain 202 floated, allowing electrons to discharge from floating gate 204 through the Flower-Nordheim tunneling.

In the method of erasing a flash memory described above, however, desired erase characteristics cannot always be obtained, because an erasure voltage is not applicable to source 203 beyond a junction breakdown voltage for the N-type diffusion region which forms source 203. In order to solve this problem, Miyawaki et al. proposed an erasing and row decoding scheme for a low supply-voltage operation of 16 Mb/64 Mb flash EEPROMs, published in the Digest of Technical Papers presented in the 1991 Symposium on VLSI Circuits held in Oiso, Japan (IEEE CAT. No. 91 CH 3018.9).

FIG. 2 shows the circuit diagram of the row decoding circuit devised by Miyawaki et al. The circuit is composed of an RX generator (a booster voltage generator), a row decoder, P-channel transfer gate T1 and P-channel transfer gate T2. Boosted voltage RX generated by the RX generator is applied to the upper-side drain of serially connected N-channel MOSFETs T3, T4 of the row decoder and is delivered to word line WL through P-channel transfer gate T1.

TABLE 1

|  | WL | RX | PG1 | PW | PG2 | NVPP |
|---|---|---|---|---|---|---|
| Read | $V_{BST}$ | $V_{BST}$ | $V_{NEG}$ | $V_{BST}$ | $V_{BST}$ | GND |
| Program | $V_{PP}$ | $V_{PPB}$ | $V_{NEG}$ | $V_{PPB}$ | $V_{PPB}$ | GND |
| Erase | $V_{ERS}$ | GND | GND | GND | $V_{ERS}$ | $V_{ERS}$ |

$V_{BST}$: boosted voltage
$V_{PPB}$: boosted $V_{PP}$
$V_{ERS}$: −12 V
$V_{NEG}$: negative voltage As is known from the operating conditions shown in Table 1, transfer gate T1 is turned on during the read and write time in order to transfer read voltage $V_{BST}$ and write voltage $V_{PPB}$ respectively, to word line WL, and is turned off during the erase time in order to shut off negative erasure voltage $V_{ERS}$ from transmitting to the row decoder. Conversely, transfer gate T2 is turned off during read and write times and is turned on during the erase time in order to transfer negative erasure voltage $V_{ERS}$ to word line WL.

It is to be noted that P-channel MOSFETs are used for transfer gates T1, T2 in order to prevent a junction leakage current which may be caused between the drain.source diffusion region and the substrate when a negative erasure voltage is applied to word line WL during erase operation. Since gate voltage PG2 of transfer gate T2 is equal to source voltage $N_{VPP}$ (=$V_{ERS}$), the erasure voltage applied to word line WL during the erase operation is $V_{ERS}-(-V_{th})=V_{ERS}+V_{th}$, where $-V_{th}$ denotes the threshold voltage of P-type transfer gate T2 for grounded back gate bias PW. For example, if $V_{ERS}=-12$ V and $-V_{th}=-2$ V, the actual voltage applied to word line is −10 V which is $V_{th}$ (=2 V) higher than $V_{ERS}$.

FIG. 3 shows a diagrammatic representation of the operating condition of the memory cell according to the conventional row decoding scheme and to that proposed by Miyawaki et al. By virtue of this scheme Miyawaki et al. were able to attain low power and high speed erase operation by making use of a source voltage of only 5 V.

A level shift circuit for a CMOS EPROM is presented in the paper of W. Ip et al. (Digest of Technical Papers, 1984 IEEE International Solid-State Circuit Conference, pp. 138 and 139). FIG. 4 shows a row decoding circuit including level shift circuit 2 and transfer gates P1, P2, wherein level shift circuit 2 is an application of the level shift circuit above and transfer gates P1, P2 correspond to transfer gates T1, T2 shown in FIG. 2. Level shift circuit 2 is intended to establish in level-shift line $X_{SFT}$, dc voltage $V_{SFT}$ predetermined so as to act as read voltage $V_R$ and write voltage $V_W$ during read operation and write operation, respectively. Transfer gates P1 and P2 act identically with transfer gates T1 and T2, respectively, described above. Level shift circuit 2 is provided with transfer gate N21 of an N-channel depletion MOSFET, which is directed both to transferring the output of row decoder 1 to level-shift line $X_{SFT}$ and to shutting off write voltage from being transmitted to row decoder 1, as will be described below. CMOS inverter 23 is made up of P-channel MOSFET P21 and N-channel MOSFET N22, having a gate input connected to level-shift line $X_{SFT}$, upper- and lower-side sources supplied with dc supply voltages VD and VSS, respectively. The transition threshold voltage of inverter 23 is set at a voltage below $V_{th}$, where $-V_{th}$ denotes the gate.source threshold voltage of transfer gate N21. D$_C$ supply voltage VD is set at read voltage $V_R$ of high level H (preferably 5 V) during read operation and at write voltage $V_W$ (preferably 12 V) during write operation. Level-shifter transistor P22 is a P-channel MOSFET with the source connected to dc supply voltage VD, the gate supplied with output g of inverter 23 and the drain connected to level-shift line $X_{SFT}$.

Transfer gate P1 is a P-channel MOSFET, which transfers dc voltage $V_{SFT}$ to word line X11 during read operation and write operation and shuts off level-shift line $X_{SFT}$ from word line X11 during erase operation. Transfer gate P2 is a P-channel MOSFET which transfers negative erasure voltage $VS=V_{ERS}$ to word line X11 during erase operation and shuts off word line X11 from the erasure voltage supply during read operation and write operation.

TABLE 2

|       | VG1        | VG2        | VG21 | VD    | VS       | VB1   | VB2   |
|-------|------------|------------|------|-------|----------|-------|-------|
| Read  | $V_{NEG}$  | H          | H    | $V_R$ | H        | H     | H     |
| Write | $V_{NEG}$  | $V_W$      | L    | $V_W$ | $V_W$    | $V_W$ | $V_W$ |
| Erase | L          | $V_{ERS}$  | H    | H     | $V_{ERS}$| L     | L     |

In read operation, gate voltage VG1 of transfer gate P1 is set at negative voltage $V_{NEG}$ (preferably −5 V), and gate voltages VG21, VG2 of transfer gates N21, P2, respectively, back gate biases VB1, VB2 of transfer gates P1, P2, respectively, and dc supply voltages VD, VS are set at high level H (normally 5 V.) This voltage setting turns transfer gate P1 on and transfer gate P2 off. Applying high level H to the gate of N-channel depletion transfer gate N21 causes the transfer gate to turn on regardless of the logic level of the row decoder output. Further, applying high-level back gate voltages VB1, VB2 to N-type wells of transfer gates P1, P2 prevents junction leakage currents between the N-type wells and P-type drain.source diffusion regions from flowing. When word line X11 is selected for read operation, row decoder 1 provides a decode signal of high level H which is applied to the input of CMOS inverter 23 through transfer gate N21. Since the transition threshold voltage of CMOS inverter 23 is below H, CMOS inverter 23 delivers low level output g, which causes P-channel level-shifter transistor P22 turn on, causing dc supply voltage VD, i.e., read voltage $V_R$, to be established in level-shift line $X_{SFT}$. Read voltage $V_R$, is then transmitted to row line X11 through transfer gate P1.

When word line X11 is not selected, row decoder 1 delivers a decode signal of low level L which is applied to the input of CMOS inverter 23 through transfer gate N21, causing output g of CMOS inverter 23 to be at dc supply voltage VD (=H), with the result that level shifter transistor P22 is cut off. Thus, low level L delivered from row decoder 1 is transmitted to word line X11 through transfer gates N21 and P1.

Accordingly, CMOS inverter 23 acts as a detector for detecting the logic level of the decode signal, and level-shifter transistor acts as a switching transistor to connect dc supply voltage VD to transfer gate P1.

In write operation, gate voltage VG1 of transfer gate P1 is set at negative voltage $V_{NEG}$ (preferably −5 V), gate voltage VG21 of transfer gate N21 is set at low level L (the ground potential), and each of back gate biases VB1 and VB2 of transfer gates P1 and P2, respectively, gate voltage VG2 of transfer gate P2 and dc supply voltages VD and VS are set at write voltage $V_W$ (preferably 10 V). This voltage setting turns transfer gate P1 on and transfer gate P2 off. Further, N-channel depletion transfer gate N21 is initially (it is assumed that the output of row decoder 1 is initially at a low level) caused to be on. Again, applying write voltage $V_W$ to N-type wells of transfer gates P1, P2 as back gate biases VB1, VB2 prevents creation of junction leakage currents. As in read operation, when word line X11 is selected for write operation, row decoder 1 delivers high level H, which causes level shift circuit to deliver write voltage $V_W$ to level shift line $X_{SFT}$. When dc voltage $V_{SFT}$ rises above threshold voltage $V_{th}$, transfer gate N21 is cut off, preventing write voltage $V_W$ from being applied to row decoder 1. Write voltage $V_W$ is transmitted to word line X11 through transfer gate P1.

In erase operation, each of gate voltage VG21 of transfer gate N21 and dc supply voltage VD is set at high level H, gate voltage VG1 of transfer gate P1, and back gate biases VB1, VB2 of transfer gates P1, P2, respectively, are set at low level L, and each of dc supply voltage VS and control gate voltage VG2 of transfer gate P2 is set at erasure voltage $V_{ERS}$ (preferably −10 V). This voltage setting causes transfer gates N21 and P2 to turn on and causes transfer gate P1 to turn off, if dc voltage $V_{SFT}$ is at low level L. In order to have dc voltage $V_{SFT}$ of low level L, means for causing the output of row decoder 1 to be at low level L during erase operation (not shown in FIG. 4) is provided in row decoder 1. In this way, dc supply voltage VS (=erasure voltage $V_{ERS}$) is applied to row line X11 through transfer gate P2 without any transfer of erasure voltage $V_{ERS}$ to level-shift line $X_{SFT}$.

A problem encounted in the row decoding circuits of prior art shown in FIG. 4 is that, since the gate of transfer gate P2 is not coupled with row decoder 1, the action of transfer gate P2 for erase operation does not respond to the decoding action of row decoder 1.

Another problem is that the negative erasure voltage actually applied to the word line is lower in absolute value than the negative voltage VS supplied to P-channel transfer gate P2 by at least $V_{TH}$, as described above. This voltage loss takes place inherently in using a P-channel MOSFET, because the gate potential has to be lower than the source potential by at least $V_{TH}$ in order for the P-channel MOSFET to be conductive. However, it is quite common to use a P-channel MOSFET for a negative-voltage transmission rather than an N-channel MOSFET to avoid creating a junction leakage current between the source.drain diffusion region and the substrate. Nevertheless, the voltage loss is an important problem to be solved in order to use the internal negative voltage source of an EEPROM device efficiently.

A further problem encountered in the prior art is that none of the prior art row decoding circuits is capable of selecting one or more word lines from a group of word lines for erase operation.

SUMMARY OF THE INVENTION

It is an object of the present invention to provide a row decoding circuit for flash memories capable of performing erase operation in response to a decoding process of the row decoder.

It is another object of the present invention to provide a row decoding circuit capable of supplying a negative erasure voltage to a word line without any voltage loss.

It is a further object of the present invention to provide a row decoding circuit capable of selecting one or more word lines from a group of word lines for erase operation.

In order to attain the first object above, a first row decoding circuit according to the present invention includes, a row decoder which delivers a decode signal when it receives an address signal for selecting a word line coupled to said row decoder, first means which delivers to the word line a predetermined dc voltage in response to the decode signal during read operation and write operation and stops delivering the predetermined dc voltage when the word line is selected during erase operation, the predetermined dc voltage being the read voltage when the word line is selected during read operation, being the write voltvoltage when the word line is selected during write operation and being a prescribed low level voltage when the word line is not selected during both read and write operations, second means which delivers to the word line a negative erasure voltage in response to the decode signal when the word line is selected during erase operation and stops delivering any voltage to the word line when the word line is not selected during erase operation, and which stops delivering any voltage to the word line when the word line is selected during both read and write operations.

In order to attain the second object above, the second means provided in the first row decoding circuit includes first transfer gate means of an N-channel MOSFET fabricated in a P-type well for transferring to the word line the negative erasure voltage when the word line is selected during erase operation, the P-type well being applied with a back gate bias equal to the negative erasure voltage at least when the first transfer gate means transfers the negative erasure voltage to the word line. The P-type well is formed in a N-type well implanted in a P-type substrate so that the P-type well, the N-type well and the P-type substrate constitute a double-well structure, the N-type well being grounded in order to electrically isolate the P-type well from the P-type substrate.

In order to attain the third object above, a second row decoding circuit according to the present invention is intended to perform erase operation on at least one word line of a plurality of word lines, and comprises a plurality of first transfer gate means each of which is connected to each word line to transfer a prescribed negative dc voltage to the word line when the word line is selected for erase operation, a plurality of second transfer gate means each of which is connected to each word line to transfer a first voltage signal to each word line, a plurality of third transfer gate means, each of which is connected to each word line to transfer a lowlevel voltage to be applied to an unselected word line, a row decoder for providing a decode signal indicating whether the group of said plurality of word lines is selected, a first level shift means for generating the first voltage signal in response to the decode signal, the first voltage signal equaling a read voltage when the group is selected during read operation, equaling a write voltage when the group is selected during write operation and equaling the low-level voltage when the group is not selected during both read and write operations, the read voltage and the write voltage being the voltages to be applied to a word line to effect the reading and writing processes, and a second level shift means for generating a second voltage signal to control switching of the plurality of first transfer gate means in response to the decode signal, the second voltage signal equaling a first control voltage capable of causing the plurality of first transfer gate means to be turned off when the group is not selected during erase operation, and equaling a second control voltage capable of causing the plurality of first transfer gate means to be turned on when the group is selected during erase operation, when the reading process and the writing process are effected, the gate voltages of said second transfer gate means being set so that second transfer gate means connected to selected word lines is turned on and the other second transfer gate means is turned off, the gate voltages of said third transfer gate are set so that third transfer gate means connected to selected word lines is turned off and the other third transfer gate means is turned on to conduct the low-level voltage, and when an erasing process is effected, the gate voltages of said second and third transfer gate means being set so that all second and third transfer gate means are turned off, and said prescribed negative dc voltages for the first transfer gate means connected to selected word lines being set at an erasure voltage and the prescribed negative dc voltages for the other first transfer gate means being set at the low-level voltage, the erasure voltage being a voltage to be applied to a word line in order to effect the erasing process.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 4 shows a row decoding circuit of the prior art.

FIG. 5 shows a schematic diagram of a first embodiment of the row decoding circuit according to the present invention.

DETAILED DESCRIPTION OF THE PREFERRED EMBODIMENTS

Figure 1:
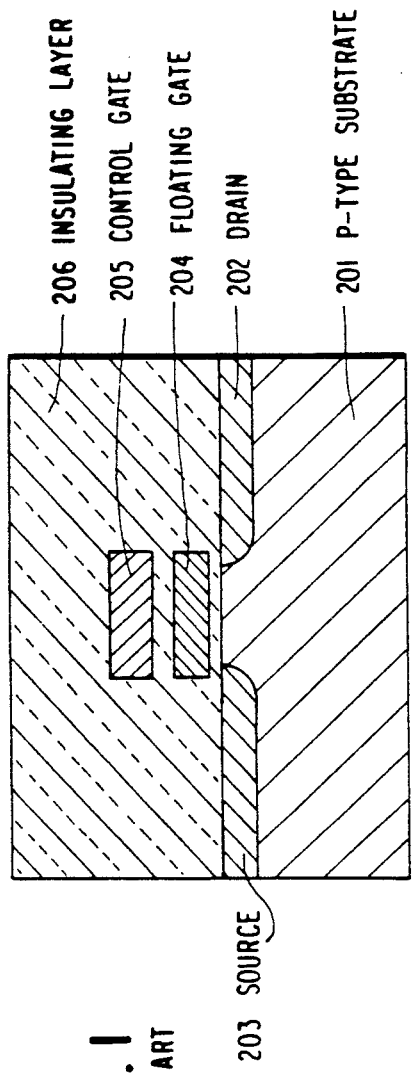
FIG. 1 shows a schematic cross-sectional view of a flash memory cell.
Figure 2:
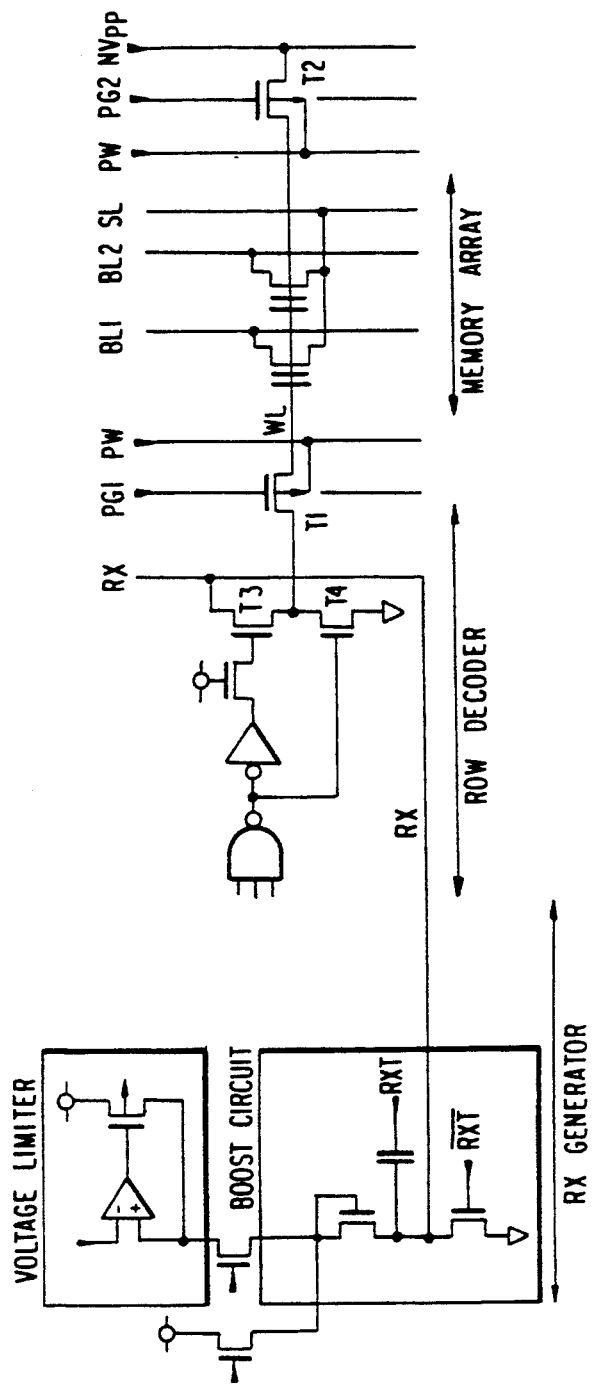
FIG. 2 shows a circuit diagram of a prior art row decoding circuit.
Figure 3:
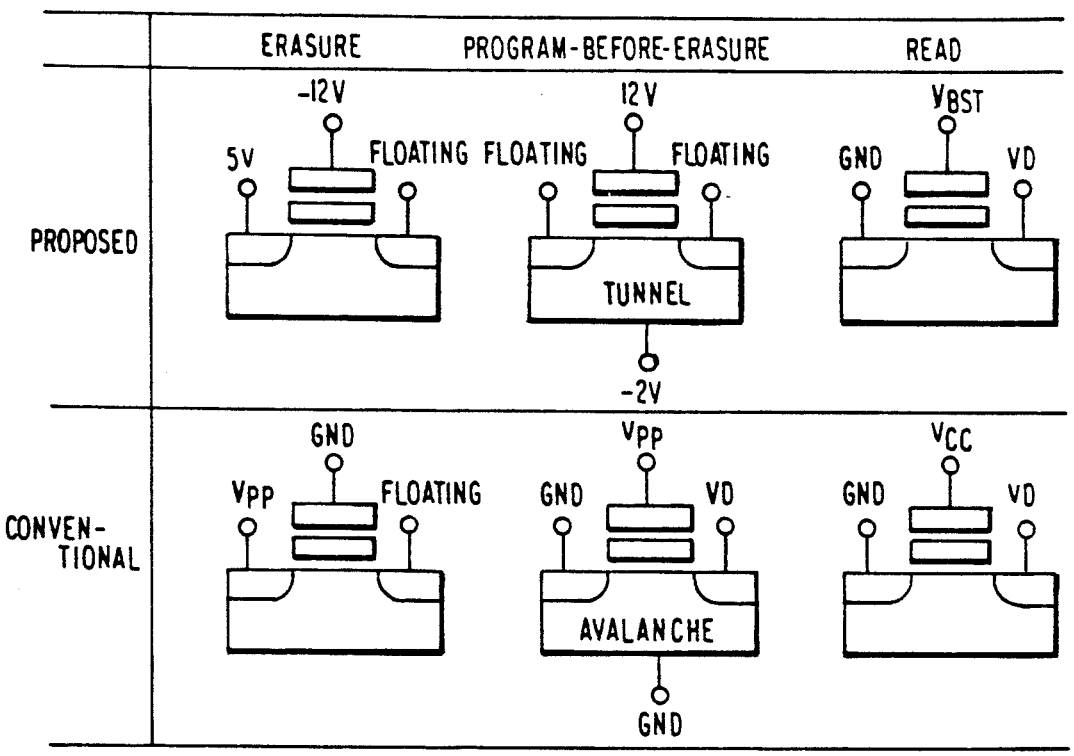
FIG. 3 shows a diagrammatic representation of the operating condition for the row decoding circuit shown in FIG. 2.
Figure 6:
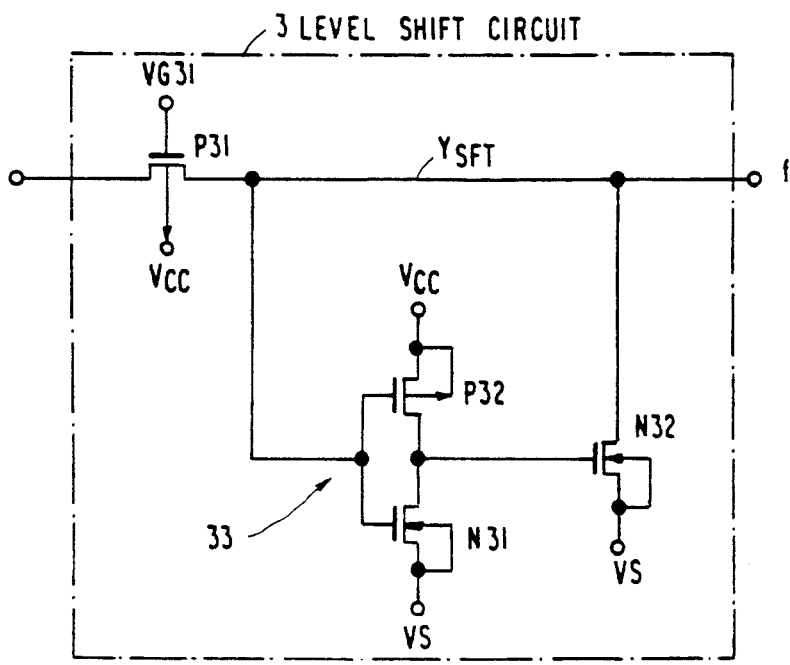
FIG. 6 shows a circuit diagram of level shift circuit 3 shown in FIG. 5.

Referring to FIGS. 5 to 7, a first embodiment of the present invention will be illustrated below. FIG. 5 represents a schematic diagram of the row decoding circuit according to the present invention, and FIG. 6 represents a circuit diagram of level shift circuit 3 shown in FIG. 5. In the figures, parts corresponding to those shown in FIG. 4 are denoted by the same reference numbers.

The row decoding circuit of the first embodiment comprises row decoder 10, level shift circuit 2, transfer gate P1 of a P-channel MOSFET, inverter 12, level shift circuit 3 and transfer gate N1 of an N-channel MOSFET. Among these circuit elements, level shift circuit 2 and transfer gate P1 perform identical operations with those shown in FIG. 4. Row decoder 10 has NAND gate E11 and inverter I1 as in conventional row decoders, and is additionally provided with exclusive-OR gate E12 with a first input connected to the output of NAND gate E11, a second input connected to erase signal ER and the output connected to the input of inverter I1. Low and high levels L, H of erase signal ER correspond to read.write operation and erase operation, respectively. The output of row decoder 10 is inverted by inverter I2. Inverter I2 serves to invert the logic of level shift circuit 3 with respect to that of level shift circuit 2. By virtue of the function of inverter I2, level shift circuit 3 inhibits transfer gate N1 from transferring dc supply voltage VS to word line X11 when level shift circuit 2 delivers read voltage $V_R$ or write voltage $V_W$ to word line X11. Level shift circuit 3 is made up of transfer gate P31, CMOS inverter 33 and level-shifter transistor N32. Transfer gate P31 is a P-channel MOSFET with the gate voltage set at low level L. By this voltage setting, transfer gate P31 is normally on and transmits the output of inverter I2 to level-shift line $Y_{SFT}$. (If the threshold voltage is $-V_{th}$ for a given back gate bias, then transfer gate P31 delivers an output voltage of $0-(-V_{th})=V_{th}$ when the gate voltage is 0.)

C MOS inverter 33 is made up of P-channel MOSFET P32 and N-channel MOSFET N31 with the upper-side source supplied with dc supply voltage VCC of high level H, the lower-side source supplied with dc supply voltage VS and the input connected to the output of transfer gate P31 through level-shift line $Y_{SFT}$. Level-shifter transistor N32, which is an N-channel MOSFET, has a source supplied with dc supply voltage VS, a drain connected to level-shift line $Y_{SFT}$ and a control gate connected to the output of CMOS inverter 33. It follows that a high level of level-shift line $Y_{SFT}$ causes the low level output of CMOS inverter 33 which causes the turn-off of level-shifter transistor N32, resulting in a high level being established in level-shift line $Y_{SFT}$, and that a low-level of level-shift line $Y_{SFT}$ causes the high-level output of CMOS inverter 33 which causes the turn-on of level-shifter transistor N32, resulting in dc supply voltage VS being delivered to level-shift line $Y_{SFT}$. Accordingly, as in level shift circuit 2, CMOS inverter 33 acts as a detector to detect the logic level of the decode signal and level-shifter transistor N32 acts as a switching transistor to connect dc supply voltage VS to the gate of transfer gate N1 through level-shift line $Y_{SFT}$. Dc supply voltage VS applied to level-shift line $Y_{SFT}$ causes transfer gate P31 to be turned off when VS is set at negative erasure voltage $V_{ERS}$ which is the case in erase operation. As a result, inverter I2 is protected from negative erasure voltage $V_{ERS}$.

Transfer gate N1 is also supplied with same dc supply voltage VS as that supplied to level shift circuit 3, and is directed to transmitting dc supply voltage VS to word line X11 in response to output signal f of level-shift circuit 3. Dc supply voltage VS is set at low level L during read operation and write operation and at negative erasure voltage during erase operation.

The combined functions of inverter I2, level shift circuit 3 and transfer gate N1 are as follows:

1. In case row decoder 10 delivers low level L, level shift circuit 3 delivers high level H which causes transfer gate N1 to turn on, with the result that low level L is applied to word line X11 during read operation and write operation, and negative erasure voltage $V_{ERS}$ is applied during erase operation 2. In case row decoder 10 delivers high level H, level shift circuit 3 delivers dc supply voltage VS which causes transfer gate N1 to turn off.

In level shift circuit 3 described above, back gate biases are applied in order to prevent creation of junction leakage current which will flow between P-type source.drain diffusion regions and the N-type well in a P-channel MOSFET and between N-type source.drain diffusion regions and the P-type well in an N-channel MOSFET. For this end, back gate biases of high level voltage VCC are applied to P-channel MOSFETs P31 and P32, and back gate biases of dc supply voltage VS are applied to N-channel MOSFETs N31, N32. As is commonly known, an EEPROM is made up of N-channel MOSFETs formed in a P-type substrate. Accordingly, P-type wells for N-channel MOSFETs N31, N32 and N1 have to be formed in a double-well structure as will be described below.

Figure 7A:
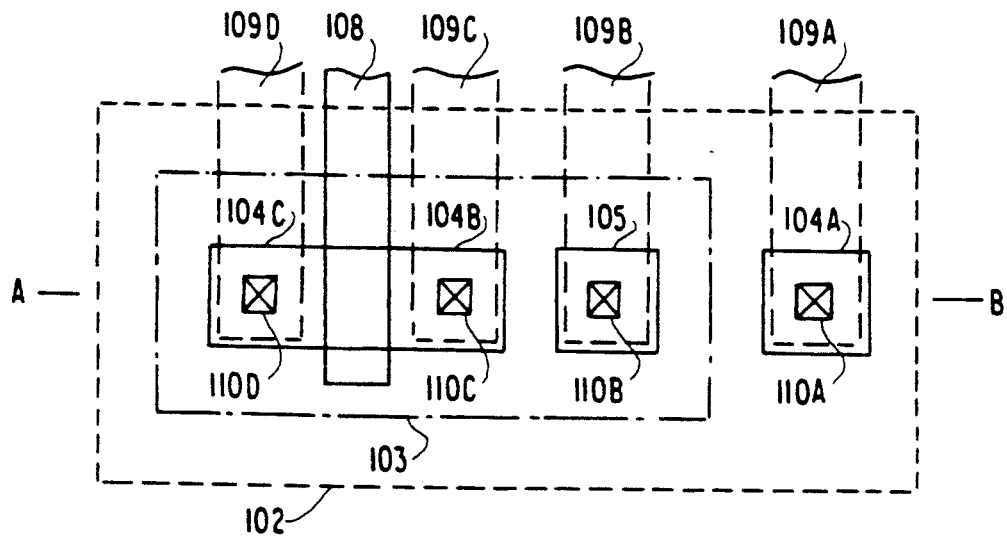
FIG. 7(A) shows a plan of an N-channel MOSFET formed in a substrate of the double-well structure.
Figure 7B:
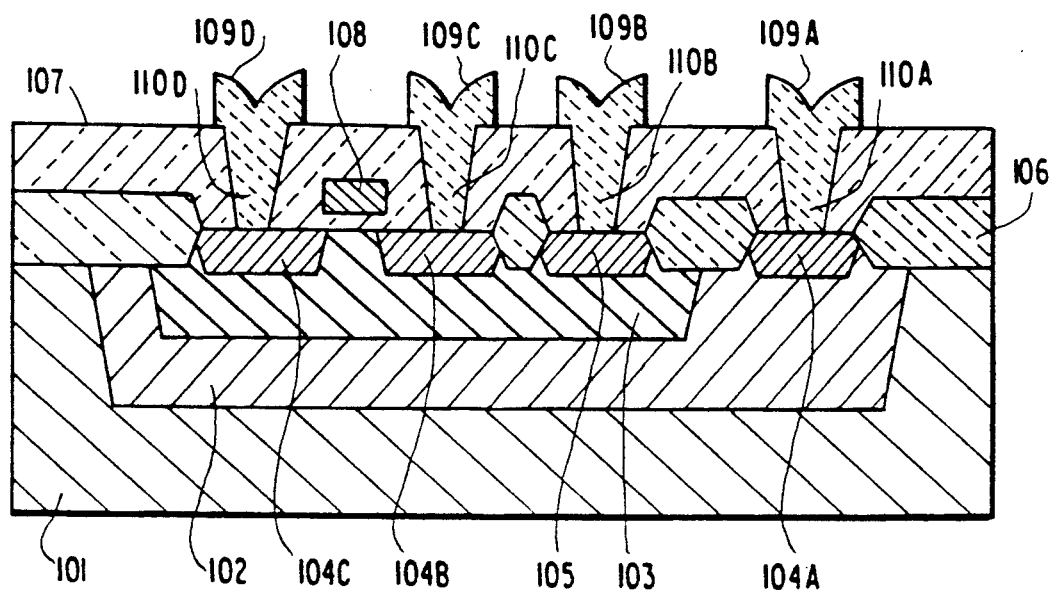
FIG. 7(B) shows an A-B cross-sectional view of the double-well structure shown in FIG. 7(A).

In order to form N-type source.drain diffusion regions and the P-type well (hereafter referred to as P well) in a P-type body substrate, each of N-type transfer gates N1, N31, N32 is arranged in a substrate of a double-well structure shown in FIG. 7. FIG. 7(A) shows a plan of an N-channel MOSFET formed in a substrate of the double-well structure. FIG. 7(B) shows an A-B cross-sectional view of the double-well structure shown in FIG. 7(A).

N well region 102 is first implanted in P-type body substrate 101, and, embraced in N well region 102, P well region 103 is next formed. In the next step, N-type diffusion regions 104A, 104B, 104C and P-type diffusion region 105 are formed, followed by formation of gate 108. Each diffusion regions are isolated with field oxide layers 106. Metallic wiring layers 109A, 109B, 109C and 109D are deposited on interlayer insulating layer 107 to be connected to N-type diffusion layer 104A, P-type diffusion layer 105, N-type diffusion layers 104B and 104C through contact holes 110A, 110B, 110C and 110D, respectively. By this arrangement, a voltage applied to metallic wiring layer 109B is delivered to P well region 103 through P-type diffusion region 105, and a voltage applied to metallic wiring layer 109 A is delivered to N well region 102 through N-type diffusion region 104A. During erase operation, P well region 103 is applied with the same negative voltage as the source (N-type diffusion region 104B or 104C) of the relevant N-channel MOSFET in order to prevent creation of a junction leakage current between N-type source.drain diffusion regions 104B, 104C and P well 103. N well region 102 is grounded in order to electrically isolate P well region 103 from P-type body substrate 101.

It should be appreciated that the double-well structure makes it possible to apply a negative erasure voltage to a N-channel transfer gate without any appreciable junction leakage current.

In operation, erase signal ER in row decoder 10 is set at low level L during read and write operations and at high level H during erase operation, where low level L and high level H represent logic levels of voltages, preferably the ground potential and 5 V with respect to the ground potential, respectively. Since row decoder 10 provides the same output as row decoder 1 in FIG. 4 during read and write operations, level shift circuit 2 and transfer gate P1 perform identical operations with those already described with regard to the row decoding circuit shown in FIG. 4.

TABLE 3

|       | VG1 | VG21 | VD    | VG31 | VCC | VS       | VB1   | VB21 | VB31 |
|-------|-----|------|-------|------|-----|----------|-------|------|------|
| read  | L   | H    | $V_R$ | L    | H   | L        | H     | L    | H    |
| write | L   | L    | $V_W$ | L    | H   | L        | $V_W$ | L    | H    |
| erase | L   | H    | H     | L    | H   | $V_{ERS}$| H     | L    | H    |

The read, write and erase operations will be described below.

1. Read Operation

Erase signal ER is set at low level L. Gate voltage VG1 of transfer gate P1, and gate voltage VG31 of transfer gate P31 in level shift circuit 3 are set at low level L. Gate voltage of transfer gate N21 in level shift circuit 2 is set at high level H. Dc supply voltage VD is set at read voltage $V_R$ (preferably 5 V).

Dc supply voltage VCC is set at high level H. Dc supply voltage VS is set at low level L. Back gate biases VB1, VB21, VB31 of transfer gates P1, N21, P31 are set at high level H, low level L, high level H, respectively.

Through these voltage settings, transfer gates P1, N21, P31 are turned on.

a) If the word line is selected

Row decoder 10 delivers high level H which causes level shift circuit 2 to deliver read voltage $V_R$ to word line X11. Further, the high level output of row decoder 10 causes level shift circuit 3 to deliver dc supply voltage VS to the gate of transfer gate N1. Since the source voltage of transfer gate N1 is also VS, transfer gate N1 is turned off. Thus, read voltage $V_R$ is established in word line X11.

b) If word line is not selected

Row decoder 10 delivers low level L which cause level shift circuit 2 to deliver low level L. Since transfer gate P1 interferes with the discharge of word line X11 from an existing voltage to true low level L, word line X11 almost reaches a low level. On the other hand, the low level output of row decoder 10 causes level shift circuit 3 to deliver high level H to the gate of transfer gate N1, which causes transfer gate N1 to be turned on. As a result, dc supply voltage VS of low level L is delivered to the word line, whereby the low-level voltage of unselected word line X11 is established.

2. Write Operation

In write operation, dc supply voltage VD is set at write voltage $V_W$ and back gate bias VB1 of transfer gate P1 is also set at write voltage $V_W$. Other voltage settings are the same as those for read operation.

In operation, each part of the row decoding circuit acts as in the read operation, except for the fact that a write voltage is established in selected word line X11.

3. Erase Operation

Erase signal ER is set at high level H. The voltage settings are the same as those for read operation except that dc supply voltage VS is set at negative erase voltage $V_{ERS}$ and dc supply voltage $V_D$ is set at high level H. Since in the present embodiment read voltage $V_R$ is equal to high level H (5 V), dc supply voltage VD is not actually changed.

a) If the word line is selected

Row decoder 10 delivers low level L, which causes level shift circuit 3 to deliver high level H to the gate electrode of transfer gate N1. As a result, transfer gate N1 is turned on and transfers dc supplied voltage VS ($=V_{ERS}$) to word line X11. The low level output of row decoder 10 causes, on the other hand, level shift circuit 2 to deliver low level L to transfer gate P1. While transfer gate P1 is initially conductive, it turns off when negative erasure voltage $V_{ERS}$ is applied to word line X11. Thus, negative erasure voltage $V_{ERS}$ is established in selected word line X11.

b) If the word line is not selected

Row decoder 10 delivers high level H, which causes level shift circuit 3 to deliver dc supply voltage VS ($=V_{ERS}$) to the control gate of transfer gate N1. Since the source voltage of transfer gate N1 is also VS ($=V_{ERS}$), transfer gate N1 is turned off. The high level output of row decoder 10 causes, on the other hand, level shift circuit 2 to deliver dc supply voltage VD ($=H$) to word line X11. As a result, as in read operation, high level H is established in unselected word line X11. The high level applied to the word line does not cause any adverse effect on the EEPROM.

Figure 8:
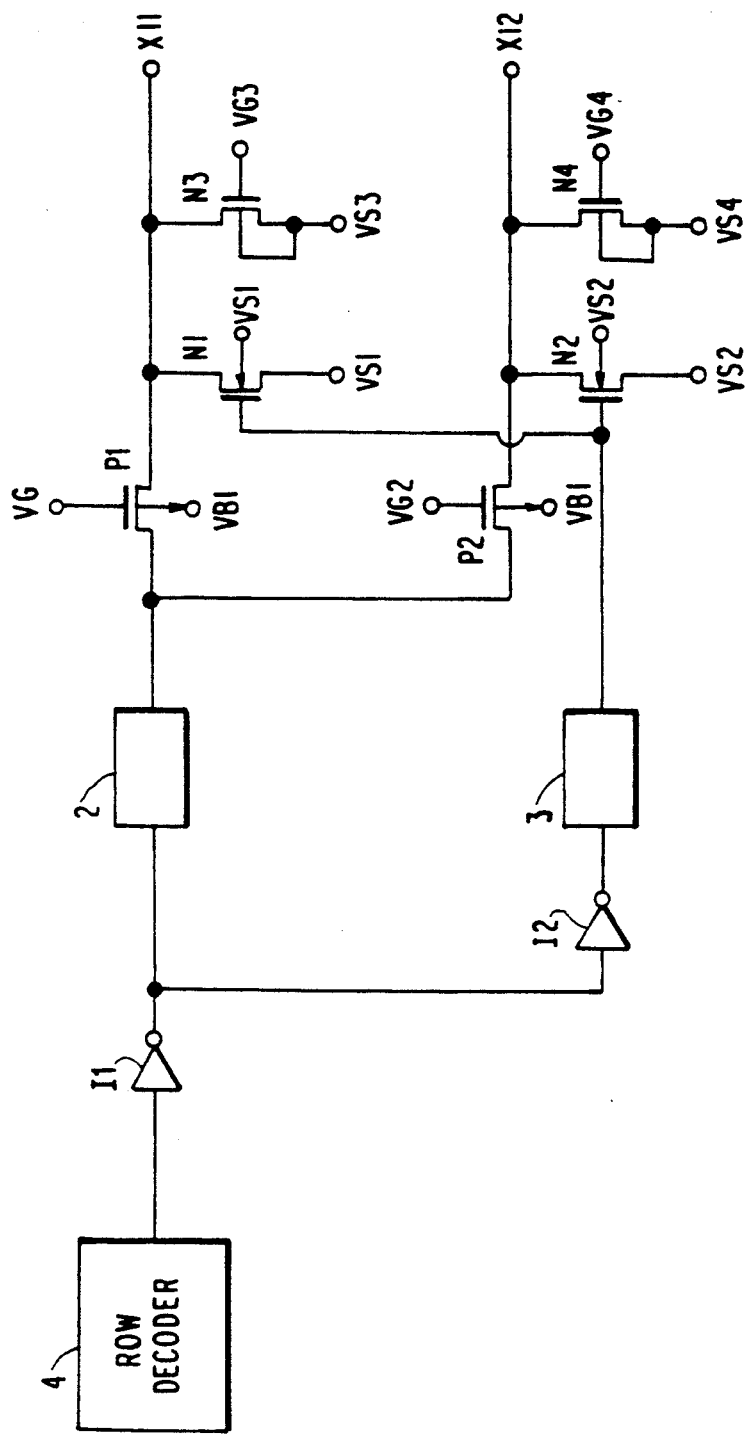
FIG. 8 shows a circuit diagram of a second embodiment of the present invention.

FIG. 8 shows a circuit diagram of a second embodiment of the present invention. This embodiment is directed to providing a row decoding circuit capable of applying negative erasure voltage $V_{ERS}$ selectively to one or more of a plurality of word lines. In the present embodiment, one of two row lines X11, X12 is selected to be applied with negative erasure voltage $V_{ERS}$. The basic features of the row decoding circuit are that all row lines X1j (j=1, 2) have common row decoder 4, level shift circuits 2, 3 and inverter I2 associated with level shift circuit 3, and that negative erasure voltage $V_{ERS}$ is applicable to each of word lines X1j without any voltage loss through N-channel transfer gate Nj which has the double-well structure as shown in FIG. 7.

The row decoding circuit of the present embodiment is provided with first transfer gates consisting of N-channel transfer gates N1, N2, second transfer gates consisting of P-channel transfer gates P1, P2 and third transfer gates consisting of N-channel transfer gates N3, N4. Each of the first transfer gates performs the same operation as that of transfer gate N1 in FIG. 5 in the sense that it transfers negative erasure voltage $V_{ERS}$ to word line X1j (j=1, 2) when the word line is selected for erase operation. The difference, however, is that it transfers low level L when the word line is not selected for erase operation. Accordingly, the first transfer gates mainly act during erase operation and are turned off during read and write operations in response to the dc voltage delivered from level shift circuit 3. In order to carry out the operation described above, negative erasure voltage $V_{ERS}$ is supplied to first transfer gate Nj connected to word line X1j which is selected for erase operation. For example, it is assumed that word line X11 is selected for both erase operation and read and write operations. Thus, dc supply voltage VS1 is set at erasure voltage $V_{ERS}$. Dc supply voltage VS2 of the other first transfer gate N2 is set at low level L.

Each of the second transfer gates performs the same operation as that of transfer gate P1 in FIG. 5, transferring read voltage $V_R$ and write voltage $V_W$ to word line X1j when word line X1j is selected for read operation and write operation, respectively, and transferring low level L when the word line X1j is not selected during read operation or write operation. Accordingly, the second transfer gates mainly act during read operation and write operation, and are turned off during erase operation. Since the address, for example (A1, A2, A3), assigned to row decoder 4 is a group address common to all word lines X11, X12, and since a single output of level shift circuit 2 is delivered to all second transfer gates P1, P2, selection of a word line to be selected for read operation or write operation is carried out by adjusting control gate voltages VG1, VG2 of transfer gates P1, P2. For example, when word line X11 is to be selected, VG1 is set at low level L, and VG2 is set at read voltage $V_R$ during read operation and at write voltage $V_W$ during write operation.

Third transfer gates N3, N4 mainly act during read and write operations. During either read operation or write operation, since both transfer gate P2 and transfer gate N2 connected to unselected word line X12 are turned off, transfer gate N4 transfers low level L to word line X12, thereby establishing the voltage level of unselected word line X12. For this purpose, dc supply voltage VS4 of transfer gate N4 is set at low level L during read and write operations. Transfer gate N3 connected with selected word line X11 is turned off by setting control gate voltage VG3 at low level L during read and write operations. Since the third transfer gates N3, N4 do not need to act during erase operation, all third transfer gates are turned off during erase operation by setting gate voltages VG3, VG4 at negative erasure voltage $V_{ERS}$.

In the present embodiment, it is necessary that all of first transfer gates N1, N2 be turned on during erase operation and turned off during read and write operations in response to a single output of level shift circuit 3. In order to make possible such operation, level shift circuit 3 is designed to deliver an output voltage equal to erasure voltage $V_{ERS}$ to the gates of first transfer gates N1, N2 during read and write operations and is designed to deliver high level H during erase operation. Since none of source voltages VS1, VS2 of first transfer gates N1, N2 is lower than gate voltage $V_{ERS}$, all first transfer gates are turned off during read and write operations. Since all of source voltages VS1, VS2 of first transfer gates N1, N2 are lower than the gate voltage of high level H, all first transfer gates are turned on during erase operation.

It is to be noted that all of the first and third transfer gates are formed in the substrate of the double-well structure, that use of the double-well structure makes it possible to use an N-channel transfer gate to transfer a negative erasure voltage, and that use of an N-channel transfer gate for a negative erasure voltage makes possible transfer of a negative erasure voltage without any voltage loss.

TABLE 4

|  | VG1 | VG2 | VG3 | VG4 | VS1 | VS2 | VS3 | VS4 |
|---|---|---|---|---|---|---|---|---|
| read | L | $V_R$ | L | H | L | L | L | L |
| write | L | $V_W$ | L | H | L | L | L | L |
| erase | H | L | $V_{ERS}$ | $V_{ERS}$ | $V_{ERS}$ | L | $V_{ERS}$ | $V_{ERS}$ |

Table 4 shows a list of the voltage settings to realize the operation of the row decoding circuit of the second embodiment, assuming that word line X11 is selected for read, write and erase operations.

Figure 9:
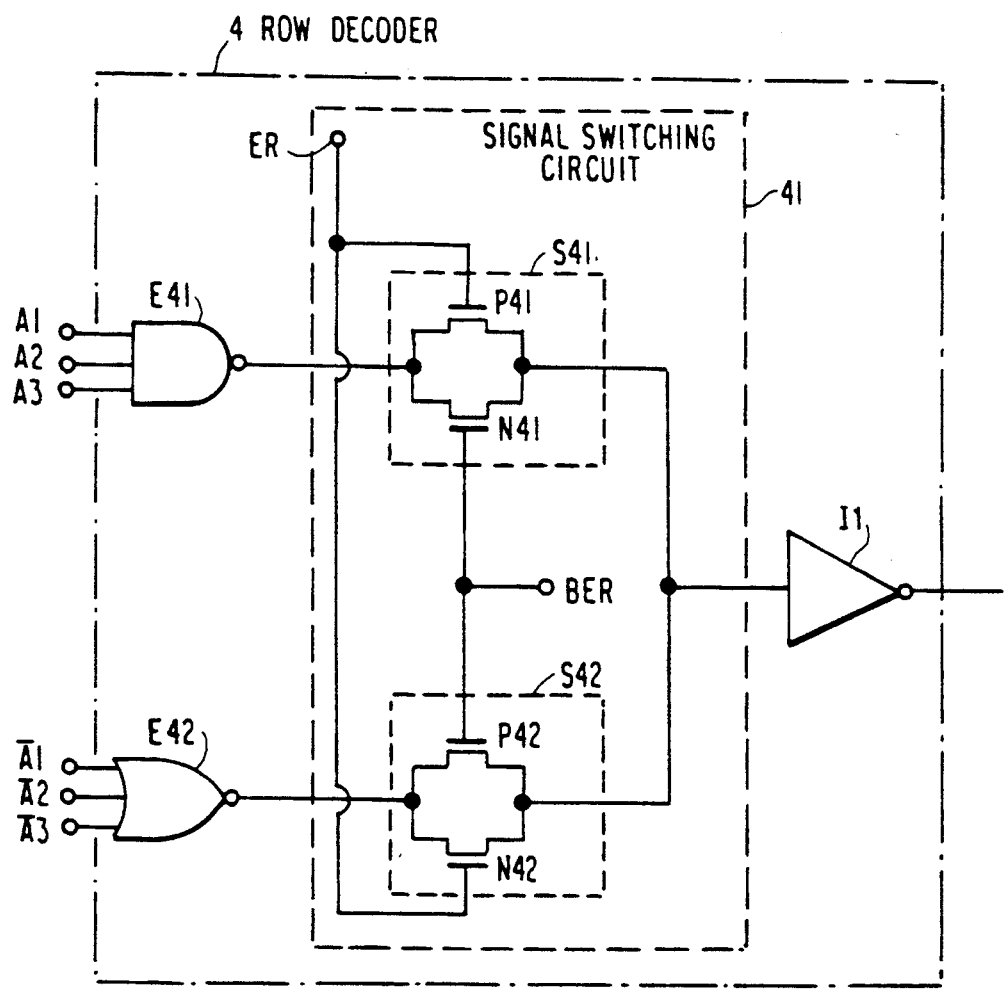
FIG. 9 shows a circuit diagram of a third embodiment of the present invention.

FIG. 9 shows another embodiment of a row decoder according to the present invention. This row decoder 4 has the same faculty as that of row decoder 10 in the sense that both row decoders 4 and 10 provide the same outputs in response to the same inputs. Row decoder 4 comprises NAND gate E41 to which an address (A1, A2, A3) is supplied, NOR gate E42 to which an inverted address ($\overline{A1}$, $\overline{A2}$, $\overline{A3}$) is supplied, signal switching circuit 41 and inverter I1. Signal switching circuit 41 transfers the output of NAND gate E41 to inverter I1 when erase signal ER is at low level L, and also transfers the output of NOR gate E42 to inverter I1 when erase signal ER is at a high level. Signal switching circuit 41 has switching elements S41, S42. Switching element S41 is made up of P-channel MOSFET P41 and N-channel MOSFET N41 connected in parallel between the output of NAND gate E41 and the input of inverter I1 with the gates of transistors P41 and N41 connected to erase signal ER and inverted erase signal BER, respectively. Switching element S42 is made up of P-channel MOSFET P42 and N-channel MOSFET N42 connected in parallel between the output of NOR gate E42 and the input of inverter I1. By this circuit, when an address (A1, A2, A3) is designated in order to read or write, erase signal ER is set at low level L, and a low-level decode signal delivered from NAND gate E41 is transmitted to inverter I1 through switching element S41. Thus, a high-level decode signal is delivered from row decoder 4. When an address (A1, A2, A3) is designated in order to erase a stored program, erase signal ER is set at high level H, and a high-level decode signal caused by the inverted address is delivered from NOR gate E42. The high-level output of NOR gate E42 is transmitted to inverter I1 through switching element S42. Thus, a low-level decode signal is delivered from row decoder 4.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A row decoding circuit for an EEPROM, including:
   a row decoder which delivers a decode signal when it receives an address signal for selecting a word line;
   first means which delivers to said word line a predetermined dc voltage in response to said decode signal during both read operation and write operation and stops delivering said predetermined dc voltage when said word line is selected during erase operation, said predetermined dc voltage being the read voltage when said word line is selected during read operation, being the write voltage when said word line is selected during write operation and being a prescribed voltage level when said word line is not selected during read operation and during write operation,
   second means which delivers to said word line a negative erasure voltage in response to said decode signal when said word line is selected during erase operation and stops delivering any voltage to said word line when said word line is not selected during erase operation; and which stops delivering any voltage to said word line when said word line is selected during both read operation and write operation, wherein said second means includes first transfer gate means of an N-channel MOSFET fabricated in a P-type well for transferring to said word line said negative erasure voltage when said word line is selected during erase operation, said P-type well being applied with a back gate bias equal to said negative erasure voltage at least when said first transfer gate means transfers said negative erasure voltage to said word line.

2. A row decoding circuit as claimed in claim 1, wherein said P-type well is formed in an N-type well implanted in a P-type substrate so that said P-type well, said N-type well and said P-type substrate constitute a double-well structure, said N-type well being grounded in order to electrically isolate said P-type well from said P-type substrate.

3. A row decoding circuit as claimed in claim 2, wherein said second means further includes second level shift means, said second level shift means, supplied with said negative erasure voltage, delivering said negative erasure voltage to the gate of said first transfer gate means when said word line is selected during both read operation and write operation, and delivering to said gate of said first transfer gate a prescribed control voltage capable of causing said first transfer gate means to be turned on when said word line is selected during erase operation.

4. A row decoding circuit as claimed in claim 3, wherein said first means includes first level shift means and second transfer gate means, said first level shift means, supplied with said predetermined dc voltage, delivering said predetermined dc voltage to said second transfer gate means when said word line is selected during both read operation and write operation and delivering said prescribed voltage level to said second transfer gate means when said word line is not selected, said second transfer gate means transferring the output of said first level shift means to said word line during both said read operation and said write operation, and being turned off when said word line is selected during said erase operation.

5. A row decoding circuit as claimed in claim 4, wherein, during both said read operation and said write operation, said row decoder delivers a decode signal of a second logic level when it receives an address assigned to itself, and delivers a decode signal of a first logic level when said row decoder does not receive the assigned address, and during said erase operation, said row decoder delivers said second decode signal of the first logic level when it receives the assigned address, and delivers said first decode signal of the second logic level when it does not receive said assigned address.

6. A row decoding circuit as claimed in claim 5, wherein said first level shift means includes first inverter means for detecting the logic level of said decode signal and first switching means for switching the connection between said predetermined dc voltage and said second transfer gate means in response to an output of said inverter means, said first switching means connecting said predetermined dc voltage to said second transfer gate means when said first inverter means detects said second logic level during both said read operation and said write operation, and disconnecting said second transfer gate means from said predetermined dc voltage when said first inverter means detects said first logic level during both said read operation and said write operation.

7. A row decoding circuit as claimed in claim 6, wherein said second level shift means includes second inverter means for detecting the logic level of said decode signal and second switching means for switching the connection between said negative erasure voltage and the control gate of said first transfer gate means in response to the output of said second inverter means, said second switching means connecting said negative erasure voltage to said gate of said first transfer gate means when said second inverter means detects said first logic level of said decode signal during erase operation and disconnecting said gate of said first transfer gate from said negative erasure voltage when said second inverter means detects said second logic level during said erase operation.

8. A row decoding circuit as claimed in claim 7, wherein said row decoder comprises a NAND gate for receiving an address of said word line, an exclusive-OR gate with one input receiving an output of said NAND gate and the other input receiving an erase signal and an inverter for inverting an output of said exclusive-OR gate, said erase signal being set at the first logic level when both said read operation and said write operation are performed and set at the second logic level when said erase operation is performed.

9. A row decoding circuit as claimed in claim 7, wherein said row decoder comprises a NAND gate for receiving an address of said word line and a NOR gate for receiving an inverted address of said word line, a first switching element which conducts the output of said NAND gate when an erase signal is at the first logic level and turns off when said erase signal is at the second logic level, a second switching element which conducts the output of said NOR gate when said erase signal is at the second logic level and turns off when said erase signal is at the first logic level and an inverter with an input connected to outputs of both first and second switching elements, said erase signal being set at the first logic level when both said read operation and said write operation are performed and set at the second logic level when said erase operation is performed.

10. A row decoding circuit for performing erase operation on at least one word line of a plurality of word lines, comprising first transfer gate means connected to each word line of said plurality of word lines to transfer a prescribed negative dc voltage to word lines selected for an erase operation, second transfer gate means connected to each word line of said plurality of word lines to transfer a first voltage signal to said word lines, third transfer gate means connected to each word line of said plurality of word lines to transfer a prescribed voltage level to said word lines, a row decoder for providing a decode signal to select said plurality of word lines, a first level shift means for generating said first voltage signal in response to said decode signal, said first voltage signal equaling a read voltage when said plurality of word lines is selected during a read operation, equaling a write voltage when said plurality of word lines is selected during a write operation and equaling said prescribed voltage level when said word lines are not selected during a read operation and during a write operation, said read voltage and said write voltages being the voltages to be applied to a word line to effect the reading and writing processes, and a second level shift means for generating a second voltage signal to control switching of said first transfer gate means in response to said decode signal, said second voltage signal equaling a first control voltage capable of causing said first transfer gate means to be turned off when said plurality of word lines is not selected during an erase operation, and equaling a second control voltage capable of causing said first transfer gate means to be turned on when said plurality of word lines is selected during an erase operation, and when the reading operating and the writing operation are effected, the gate voltages of said second transfer gate means being set so that second transfer gate means connected to selected word lines is turned on and second transfer gate means connected to unselected word lines is turned off, the gate voltages of said third transfer gate are set so that third transfer gate means connected to selected word lines is turned off and third transfer gate means connected to unselected word lines is turned on to conduct said prescribed voltage level, and when an erasing process is effected, the gate voltages of said second and third transfer gate means being set so that second and third transfer gate means are turned off, and said prescribed negative dc voltage for said first transfer gate means connected to selected word lines being set at an erasure voltage and said prescribed negative dc voltages for first transfer gate means connected to unselected word lines being set at said prescribed voltage level, said erasure voltage being a voltage to be applied to a word line said erasing process is to be effected on.

11. A row decoding circuit as claimed in claim 10, wherein said first transfer gate means are of N-channel MOSFETs formed in a double-well structure such that a N-type well is implanted into a P-type substrate, a P-type well is implanted into said N-type well and said N-channel MOSFET is formed in said P-type well, said N-type well being grounded.

* * * * *

UNITED STATES PATENT AND TRADEMARK OFFICE
CERTIFICATE OF CORRECTION

PATENT NO. : 5,295,106

DATED : March 15, 1994

INVENTOR(S) : Toshikatsu Jinbo

It is certified that error appears in the above-identified patent and that said Letters Patent is hereby corrected as shown below:

Column 2, line 32, delete "EPROM", and insert --EEPROM--;

Signed and Sealed this

Thirtieth Day of August, 1994

Attest:

BRUCE LEHMAN

*Attesting Officer*    *Commissioner of Patents and Trademarks*